United States Patent [19]

Schweitzer, Jr.

[11] 3,991,366
[45] Nov. 9, 1976

[54] MEANS FOR INDICATING ABNORMAL HIGH CURRENT FLOW IN A HIGH VOLTAGE ELECTRIC POWER DISTRIBUTION CONDUCTOR AND FOR RESETTING AND TESTING SAME

[76] Inventor: Edmund O. Schweitzer, Jr., 1002 Dundee Road, Northbrook, Ill. 60062

[22] Filed: Apr. 10, 1975

[21] Appl. No.: 566,990

[52] U.S. Cl. .............................. 324/133; 340/253 A; 317/22
[51] Int. Cl.² .................... G01R 19/16; G01R 31/02
[58] Field of Search .............. 324/127, 133; 317/22; 340/248 C, 253 R, 253 A, 253 P

[56] References Cited
UNITED STATES PATENTS

| | | | |
|---|---|---|---|
| 3,375,510 | 3/1968 | Pitches............................... | 324/133 |
| 3,676,740 | 7/1972 | Schweitzer, Jr..................... | 324/133 |
| 3,702,966 | 11/1972 | Schweitzer, Jr..................... | 324/133 |
| 3,708,724 | 1/1973 | Schweitzer, Jr..................... | 324/133 |
| 3,715,742 | 2/1973 | Schweitzer, Jr..................... | 324/133 |
| 3,735,248 | 5/1973 | Reese................................. | 324/133 |
| 3,816,816 | 6/1974 | Schweitzer, Jr..................... | 324/133 |

Primary Examiner—Robert J. Corcoran
Attorney, Agent, or Firm—Lockwood, Dewey, Zickert & Alex

[57] ABSTRACT

An indicator for flow of fault current in a conductor is enclosed in a housing carrying a metallic clamp for detachable mounting on the conductor. The indicator is operated by closure of a switch in response to flow of fault current in the conductor and is reset by the voltage developed between the clamp and ground. The indicator is checked by application of a permanent magnet to close the switch and an external voltage to reset the indicator. The indicator also can be reset by flow of normal current in the conductor employing a winding on a magnetic core surrounding the conductor and encapsulated with the switch.

2 Claims, 7 Drawing Figures

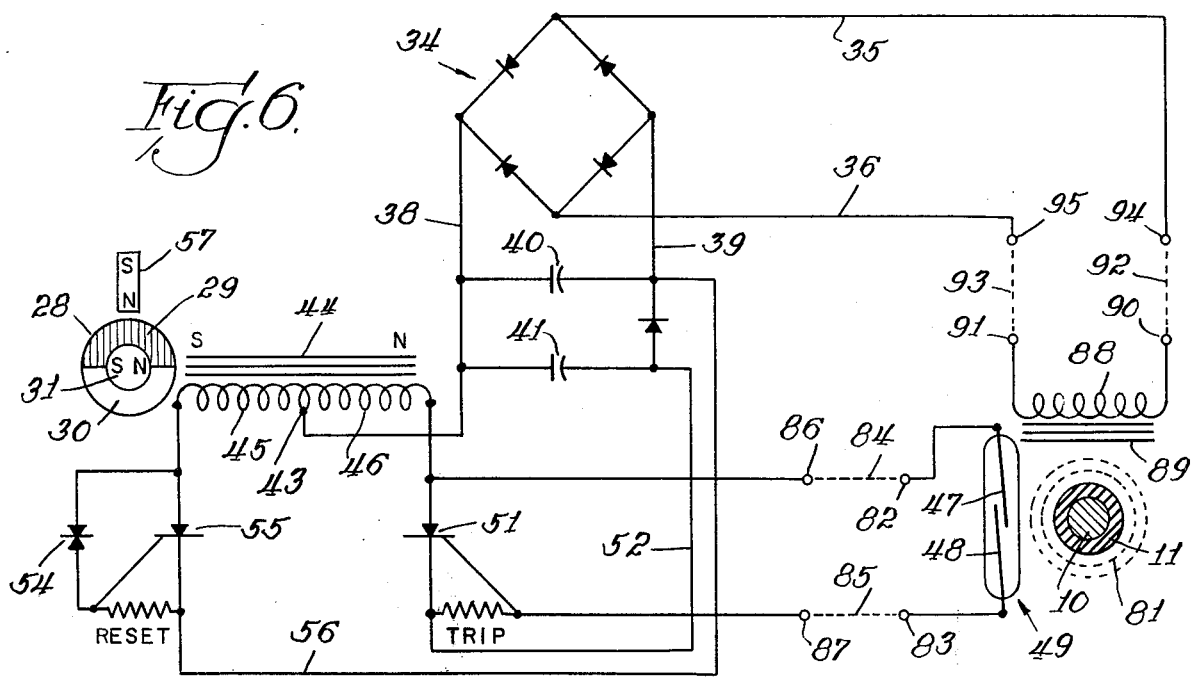
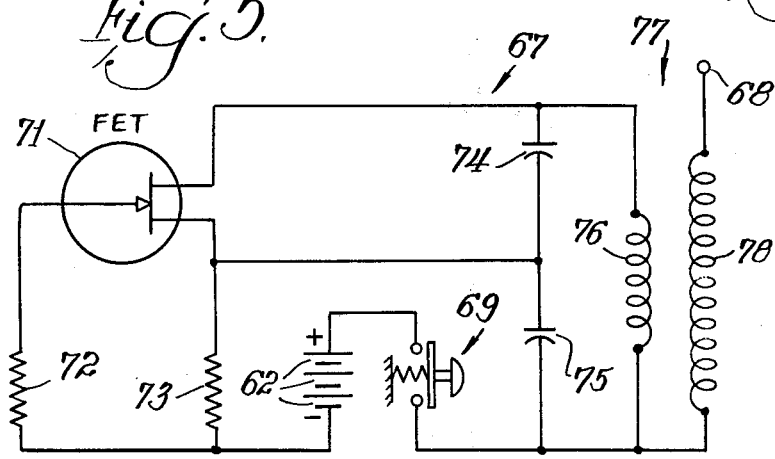
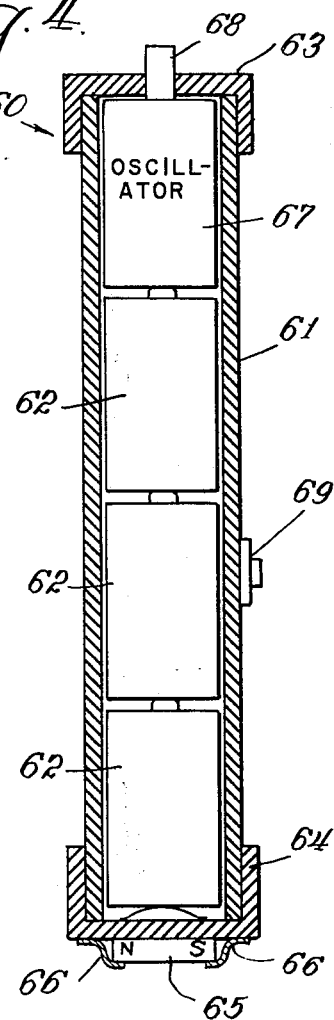

MEANS FOR INDICATING ABNORMAL HIGH CURRENT FLOW IN A HIGH VOLTAGE ELECTRIC POWER DISTRIBUTION CONDUCTOR AND FOR RESETTING AND TESTING SAME

This invention relates, generally to automatically resettable alternating current fault indicators and it has particular relation to such indicators for mounting on high voltage conductors and to means for testing the same. It constitutes an improvement over the construction disclosed in my application Ser. No. 503,719, filed Sept. 6, 1974, now U.S. Pat. No. 3,906,477, issued Sept. 16, 1975.

Among the objects of this invention are: To provide a voltage resettable fault indicator arranged for detachable mounting on a high voltage conductor; to apply a capacitive voltage appearing between detachable metallic clamp means secured to the conductor and mounted on a housing enclosing the fault indicator and associated circuitry and a conducting sleeve or coating over the housing; to provide an eye on the housing for receiving a prong of a handling tool; to provide for testing the operation of the fault indicator; to employ a permanent magnet for closing a switch in the fault indicator to simulate operation resulting from fault current flow; to employ a battery operated oscillator to generate a test voltage simulating the voltage of the conductor to reset the indicator; to provide for resetting the indicator as a result of normal current flow in the conductor; and to encapsulate with a magnetic core surrounding the conductor a current responsive winding and a switch responsive to magnetic flux generated by flow of fault current in the conductor.

In the drawings:

FIG. 4 is a vertical sectional view through a manually operable device for testing the operation of the fault indicator.

FIG. 5 shows the circuitry for a battery operated oscillator forming a part of the test device.

FIG. 6 shows the circuitry for a normal current resettable fault indicator arranged to be located remotely from the conductor in which fault current may flow.

FIG. 7 illustrates how the normal current responsive winding and fault current responsive switch can be encapsulated with a magnetic core surrounding the conductor.

Figure 1:
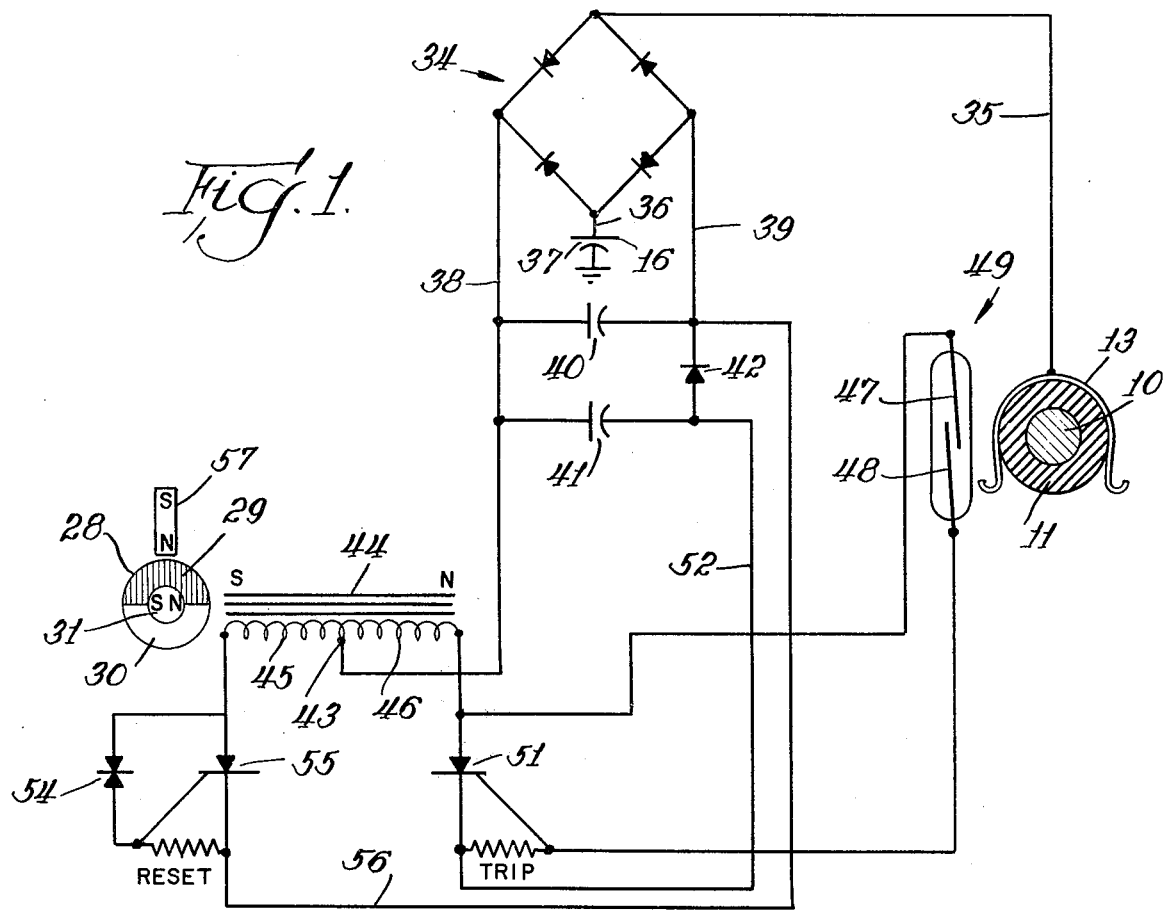
FIG. 1 shows the circuitry for a voltage resettable fault indicator arranged to be detachably mounted on a conductor.
Figure 2:
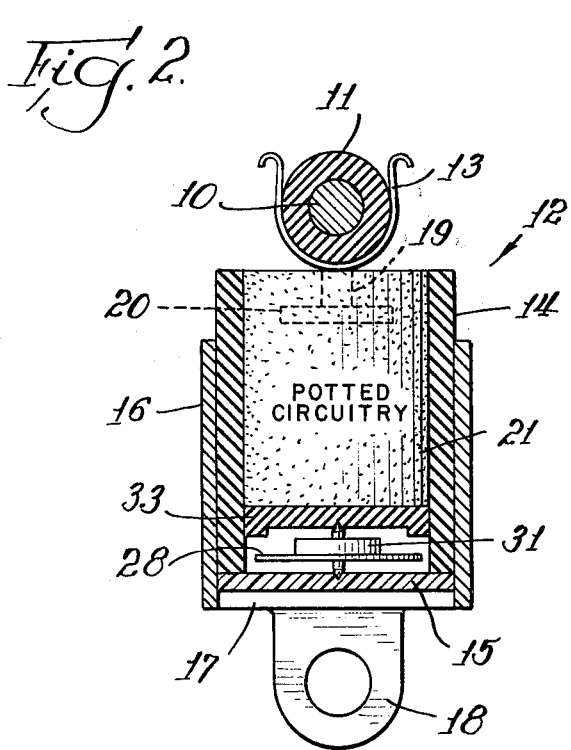
FIG. 2 is a vertical sectional view through the conductor and the housing for the fault indicator.
Figure 3:
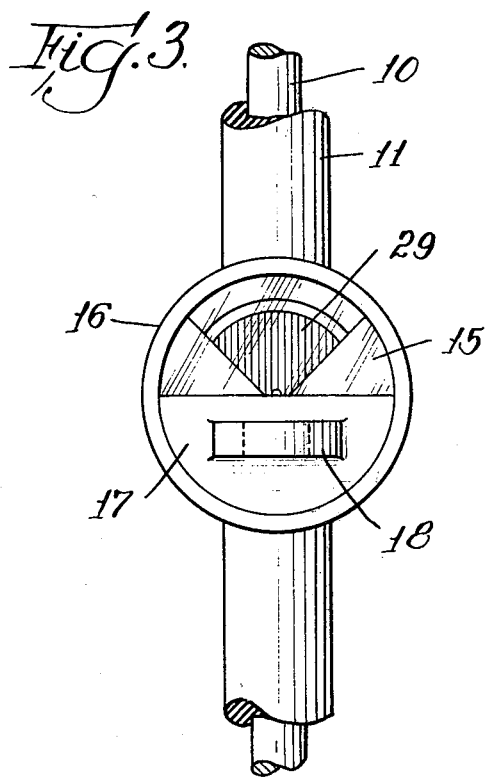
FIG. 3 is a bottom plan view of FIG. 2.

Referring now particularly to FIGS. 1, 2 and 3, it will be observed that reference character 10 designates a high voltage alternating current conductor that may be energized at voltages ranging upwardly from 2,300 volts and arranged to conduct normal 60 Hz current of the order of 200 amperes and likely to conduct fault current ranging upwardly from 1000 amperes. The conductor 10 is provided with an insulating covering 11. In order to detect the flow of fault current in the conductor 10 a fault indicator, shown generally at 12, is employed. It is arranged to be detachably mounted on the insulated conductor 10 by means of a U-shaped resilient metallic clamp 13. The fault indicator 12 includes an insulating housing 14 having a transparent cover 15. The housing 14 is enclosed by a conductive coating or sleeve 16 which has a semicircular section 17 overlying the cover 15. An eye 18, formed integrally with the coating or sleeve 16, is arranged to receive a prong of a handling tool for applying the fault indicator 12 to and removing it from the insulated conductor 10. The clamp 13 has an extension 19 that terminates in a disc 20 which is embedded in potting compound 21 containing, in addition, the circuitry for the fault indicator 12.

The occurrence of flow of fault current in the conductor 10 is indicated by a target disc 28 having a red section 29 and a white section 30 only one of which is visible at a time through the transparent cover 15. The target disc 28 has an annular permanent magnet 31 pivoted therewith between the cover 15 and a washer 33 that is stationarily mounted in the housing 14.

The circuitry for shifting the target disc 28 between fault indicating and non-fault indicating positions is shown in FIG. 1. It includes a full wave rectifier 34 that is connected at one input terminal by a conductor 35 to the metallic clamp 13. A conductor 36 connects another input terminal of the rectifier 34 to the conductive coating 16 and thereby to ground or another conductor like conductor 10. In this manner the rectifier 34 is capacitively connected, as indicated by capacitor 37, for energization between the conductor 10 and ground or another conductor. The output terminals of the rectifier 34 are connected by conductors 38 and 39 to charge first and second capacitors 40 and 41 in parallel. A blocking diode 42 is inserted in the conductor 39 between the capacitors 40 and 41 to prevent discharge of capacitor 41 for resetting the fault indicator 12 while permitting their being charged simultaneously and discharged simultaneously for tripping the fault indicator 12 to the fault indicating position.

The fault indicator 12 includes a center tapped winding 43, on a magnetic core 44, which has reset and trip sections 45 and 46. It is illustrated in the tripped condition with the magnetic core 44 having the polarities indicated and the red section 29 of the target disc 28 visible through the transparent cover 15. This was the result of the flow of fault current in the conductor 10 sufficient to generate an alternating magnetic field great enough to close contacts 47 and 48 of a reed switch 49, the contacts including magnetic material. On closure of contacts 47 and 48 as a result of predetermined flow of fault current in conductor 10 voltage sensitive switch means 51, such as an SCR, was rendered conducting to discharge both capacitors 40 and 41 through trip section 46 over conductor 52. Presumably a circuit breaker interrupts the flow of fault current in the conductor 10.

When the conductor 10 is reenergized and normal current flows through it, a voltage is applied to the rectifier 34 and capacitors 40 and 41 are charged. On application of sufficient direct voltage to a trigger diode 54 voltage sensitive switch means 55, such as an SCR, is rendered conducting and reset section 45 is energized over conductor conductor 56 from capacitor 40. The polarity of the magnetic core 44 is reversed and the target disc 28 is pivoted through 180° to display the white section 30 and indicate through the transparent cover 15 that no fault condition exists on conductor 10.

A stationary permanent magnet 57 co-operates with the annular permanent magnet 31 to bias the latter into either of its alternate positions.

It is desirable to provide for testing the operation of the fault indicator 12. It is removed from the conductor 10 to do this. The testing tool, shown generally at 60 in FIG. 4 can be employed for this purpose. It resembles a flashlight and comprises a tubular insulating housing 61 within which are located series connected batteries 62. End caps 63 and 64 close the ends of the housing 61. End cap 64 has a bar magnet 65 secured thereto by clamps 66.

When the fault indicator 12 is removed from the conductor for testing, it is assumed that the capacitors 40 and 41 are charged and that the target disc 28 is in the non-fault indicating position with the magnetic core 44 magnetized with polarities opposite to those shown in FIG. 1. The testing tool then is positioned to place the bar magnet adjacent the reed switch 49. Its contacts 47 and 48 are closed to render the voltage sensitive switch means 51 conducting thereby discharging capacitors 40 and 41, energizing trip section 46 of winding 43 reversing the polarities of the core 44, and pivoting the target disc 28 to display the red or fault indicating section 29.

For resetting the fault indicator 12 an oscillator 67 is located in the housing 61. The oscillator 67 has a terminal 68 projecting through end cap 63 and is powered by the batteries 62 on closure of a manually operable switch 69. The circuit for the oscillator 67 is illustrated in FIG. 5. It includes a field effect transistor 71 which is energized from the batteries 62 through resistors 72 and 73 on closure of switch 69. The circuit includes series connected capacitors 74 and 75 in shunt with a primary winding 76 of an air core transformer 77 having a high voltage secondary winding 78 connected to the terminal 68.

The fault indicator 12 is reset by contacting the metallic clamp 13 with the terminal 68 and closing the switch 69. The capacitors 40 and 41 are recharged to a voltage sufficient to cause trigger diode 54 to break down and render the voltage sensitive switch means 55 conducting. Capacitor 40 then discharges through the reset section 45 of winding 43 to reverse the polarity of the magnetic core 44. The target disc 28 is then pivoted to display the white section 30 and indicate that the fault indicator has been properly reset.

FIGS. 6 and 7 show how the fault indicator 12 can be reset on restoration of normal current flow in the conductor 10. The alternating magnetic field about the conductor 10 is indicated at 81. The reed switch 49 is positioned, as before, in this magnetic field and its contacts 47 and 48 are closed to render the voltage responsive switch means 51 conducting on flow of predetermined fault current. The reed switch 49 may be located in a position remote from the fault indicator 12. Accordingly, contacts 47 and 48 are connected to terminals 82 and 83 which are interconnected by conductors 84 and 85, shown by broken lines, of indefinite length to terminals 86 and 87 which are connected across the voltage responsive switch means 51.

In order to provide a response to restoration of normal current flow in the conductor 10 a winding 88 is located on a magnetic core 89 that embraces the conductor 10. The magnetic core 10 can be constructed as disclosed in my U.S. Pat. No. 3,725,832, issued Apr. 3, 1973. The winding 88 is connected to terminals 90 and 91 which are connected by conductors 93 and 94, shown by broken lines, to terminals 94 and 95 that are connected by the conductors 35 and 36 across the rectifier 34.

Preferably, as shown in FIG. 7, the reed switch 49 is located within the magnetic core 89 between the conductor 10 and the winding 88. The assembly then is encapsulated as indicated by the broken line outline 96 to provide an integral assembly on the conductor 10 with a four conductor cable, comprising conductors 84, 85, 92 and 93, connecting it to the fault indicator 12 located at a remote point.

It will be understood that, on flow of fault current in the conductor 10, contacts 47 and 48 are closed to render the voltage responsive switch means 51 conducting to shift the target disc 28 to the fault indicating position. Presumably the flow of fault current is interrupted and subsequently the flow of normal current is restored. Rectifier 34 is energized and capacitors 40 and 41 are charged. When they are charged sufficiently, trigger diode 54 breaks down, voltage sensitive switch means 55 is rendered conducting, and capacitor 40 is discharged to shift the target disc 28 to the non-fault indicating position.

I claim:

1. For combination with fault indicating means for a high voltage alternating current carrying conductor having switch means of the type that is operated by a magnetic field and arranged to be closed by the magnetic field generated on flow of fault current in said conductor to shift an indicator to fault indicating position and means for resetting said indicator from fault indicating position to non-fault indicating position in response to the voltage of said conductor; means for testing the operation of said fault indicating means comprising permanent magnet means for application to said switch means for closing said switch means to shift said indicator to fault indicating position, and means for applying a voltage to said resetting means to shift said indicator from fault indicating position to non-fault indicating position.

2. Testing means according to claim 1 wherein an elongated housing carries said permanent magnet means at one end and a terminal of a battery operated oscillator at the other end for application to said resetting means.

* * * * *